(12) United States Patent
Mishima

(10) Patent No.: US 8,659,743 B2
(45) Date of Patent: Feb. 25, 2014

(54) DETECTION APPARATUS, EXPOSURE APPARATUS, AND DEVICE FABRICATION METHOD

(75) Inventor: Kazuhiko Mishima, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 250 days.

(21) Appl. No.: 12/853,705

(22) Filed: Aug. 10, 2010

(65) Prior Publication Data

US 2011/0033790 A1   Feb. 10, 2011

(30) Foreign Application Priority Data

Aug. 10, 2009   (JP) .................................. 2009-186150

(51) Int. Cl.
*G03B 27/42*   (2006.01)

(52) U.S. Cl.
USPC ..................... 355/53; 355/30; 355/72; 355/77

(58) Field of Classification Search
USPC ............. 355/53; 356/400, 401; 359/441, 813; 369/53.19
See application file for complete search history.

(56) References Cited

U.S. PATENT DOCUMENTS

| | | | |
|---|---|---|---|
| 6,768,539 B2 | 7/2004 | Gui et al. | |
| 2005/0140951 A1* | 6/2005 | Van Buel et al. | 355/53 |
| 2008/0106714 A1* | 5/2008 | Okita | 355/53 |

FOREIGN PATENT DOCUMENTS

| | | |
|---|---|---|
| JP | 09-017831 A | 1/1997 |
| JP | 10-307004 A | 11/1998 |
| JP | 2002-280299 A | 9/2002 |
| JP | 2005005444 A | 1/2005 |
| KR | 2002-0061525 A | 7/2002 |
| KR | 10-2007-0041580 A | 4/2007 |
| TW | 200623232 A | 7/2006 |

OTHER PUBLICATIONS

Machine translation for JP10307004 is attached.*
Office Action issued in corresponding Korean Patent Application 12-2010-0074654 issued Oct. 19, 2012.
Taiwanese Office Action cited in Taiwanese counterpart application No. TW099124551, dated Jul. 8, 2013. Partial English translation provided.
Japanese Office Action cited in Japanese counterpart application No. JP2009-186150, dated Jul. 19, 2013.

* cited by examiner

*Primary Examiner* — Steven H Whitesell Gordon
*Assistant Examiner* — Mesfin T Asfaw
(74) *Attorney, Agent, or Firm* — Rossi, Kimms & McDowell LLP

(57) ABSTRACT

The present invention provides a detection apparatus which detects an upper-surface mark and lower-surface mark formed on an upper surface and lower surface, respectively, of a substrate, the apparatus including an optical system configured to form an image of the lower-surface mark on a light-receiving surface of a photoelectric conversion device using a first light, with a wavelength which is transmitted through the substrate, which is emitted by a light source, applied to the lower-surface mark from the upper surface of the substrate, and reflected by the lower-surface mark, and to form an image of the upper-surface mark on the light-receiving surface of the photoelectric conversion device using a second light, with a wavelength which is not transmitted through the substrate, which is emitted by the light source, applied to the upper-surface mark from the upper surface of the substrate, and reflected by the upper-surface mark.

20 Claims, 8 Drawing Sheets

FIG. 5
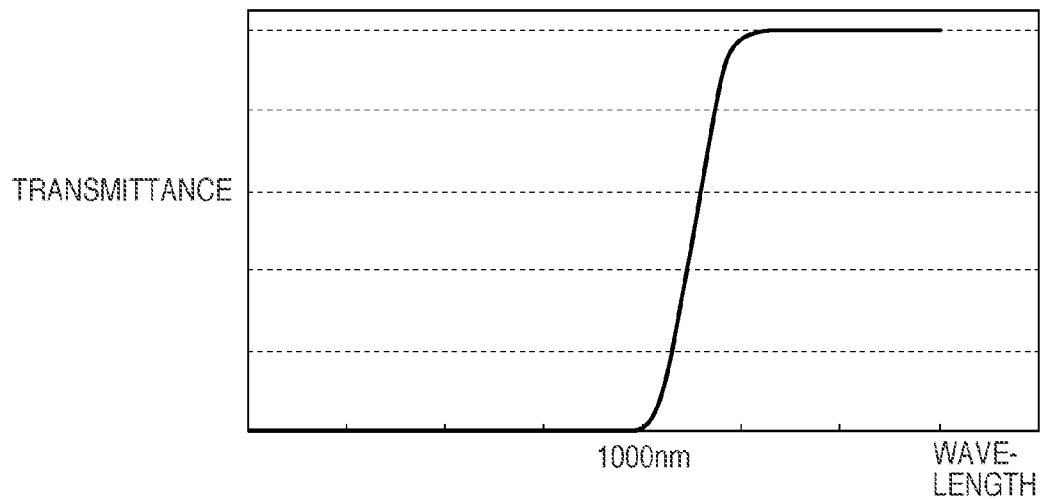
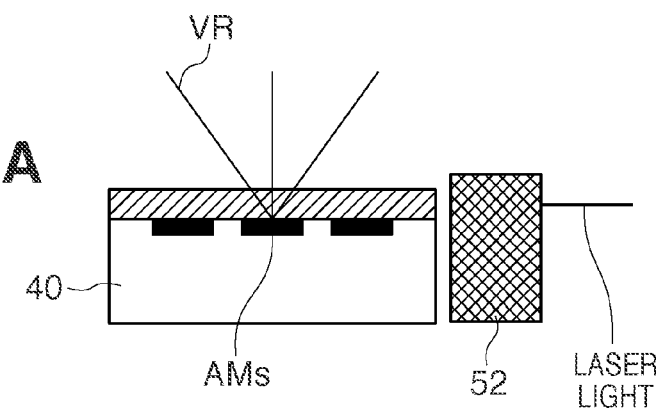
FIG. 6A
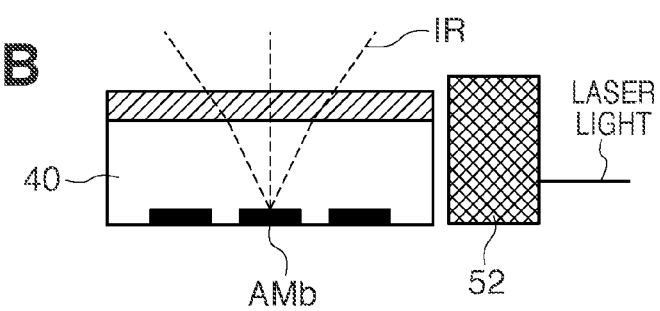
FIG. 6B

DETECTION APPARATUS, EXPOSURE APPARATUS, AND DEVICE FABRICATION METHOD

BACKGROUND OF THE INVENTION

1. Field of the Invention

The present invention relates to a detection apparatus, an exposure apparatus, and a device fabrication method.

2. Description of the Related Art

An exposure apparatus is employed to fabricate semiconductor devices. The exposure apparatus projects and transfers a circuit pattern formed on a reticle (mask) onto, for example, a wafer (substrate) by a projection optical system. In recent years, an exposure apparatus needs to fabricate not only one-dimensional IC chips such as semiconductor memories and logic circuits, but also special devices such as three-dimensional multilayer chips and MEMSs. The fabrication of such special devices requires less line width resolution and overlay accuracy but requires a larger depth of focus than the fabrication of one-dimensional IC chips.

Also, an exposure apparatus performs a special process to expose the upper surface of a wafer (for example, an Si wafer) based on alignment marks formed on the lower surface side of the wafer. This process is necessary to form a through-hole via from the upper surface side of a wafer to its lower surface side, thereby connecting the former side to a circuit on the latter side. Under the circumstance, Japanese Patent Laid-Open No. 2002-280299 proposes a technique for forming an alignment detection system on the lower surface side (wafer chuck side) of the wafer to detect the alignment marks on the lower surface side of the wafer.

Unfortunately, an alignment detection system formed on the lower surface side of the wafer can detect only alignment marks that fall within a specific region (that is, the detection region of the alignment detection system). In other words, the conventional technique cannot detect alignment marks placed at arbitrary positions on the wafer. Also, an alignment detection system of an exposure apparatus needs to detect not only alignment marks on the lower surface side of the wafer but also those on the upper surface side of the wafer.

SUMMARY OF THE INVENTION

The present invention provides a technique which can detect both a lower-surface-side mark and upper-surface-side mark formed in a substrate.

According to one aspect of the present invention, there is provided a detection apparatus which detects an upper-surface mark and lower-surface mark formed on an upper surface and lower surface, respectively, of a substrate onto which a pattern of a reticle is transferred, the apparatus including a light source configured to emit first light with a wavelength which is transmitted through the substrate, and second light with a wavelength which is not transmitted through the substrate, a photoelectric conversion device, and an optical system configured to form an image of the lower-surface mark on a light-receiving surface of the photoelectric conversion device using the first light which is emitted by the light source, applied to the lower-surface mark from the upper surface of the substrate, and reflected by the lower-surface mark, and to form an image of the upper-surface mark on the light-receiving surface of the photoelectric conversion device using the second light which is emitted by the light source, applied to the upper-surface mark from the upper surface of the substrate, and reflected by the upper-surface mark.

Further features of the present invention will become apparent from the following description of exemplary embodiments with reference to the attached drawings.

BRIEF DESCRIPTION OF THE DRAWINGS

FIG. 5 is a graph showing the transmittance of a wafer (Si substrate) as a function of the wavelength of the incident light.

FIGS. 6A and 6B are sectional views schematically showing a cross-section of the wafer.

DESCRIPTION OF THE EMBODIMENTS

Figure 1:
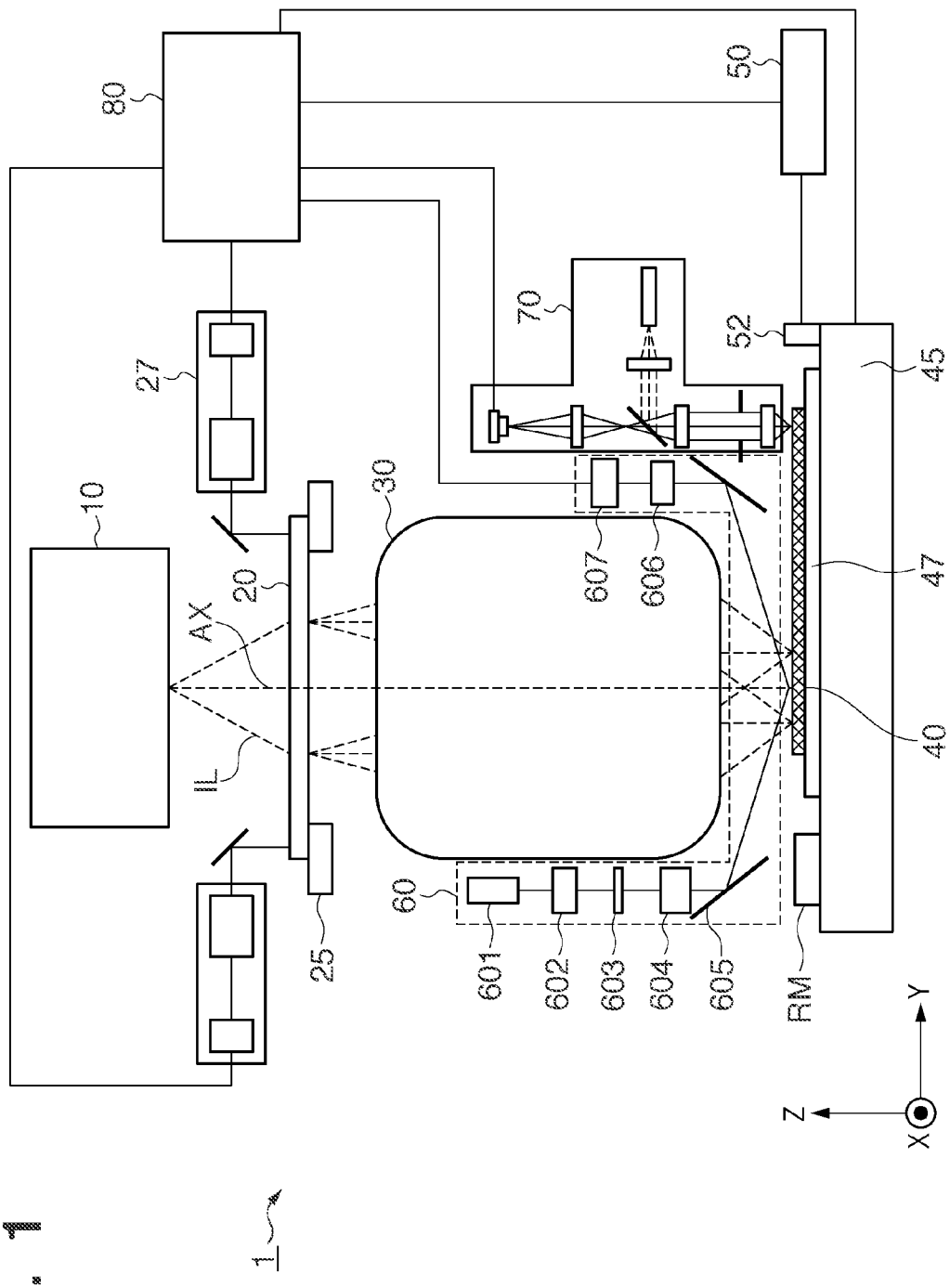
FIG. 1 is a schematic view showing the arrangement of an exposure apparatus according to one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 1 according to one aspect of the present invention. In this embodiment, the exposure apparatus 1 is a projection exposure apparatus which transfers the pattern of a reticle onto a wafer by the step & scan scheme. However, the exposure apparatus 1 can also adopt the step & repeat scheme or another exposure scheme.

The exposure apparatus 1 includes an illumination optical system 10, reticle stage 25, alignment scope 27, projection optical system 30, wafer stage 45, interferometer 50, focus position measurement system 60, alignment detection apparatus 70, and control unit 80.

The illumination optical system 10 illuminates a reticle 20 held by the reticle stage 25 with light (exposure light) from a light source. The reticle 20 is positioned on the reticle stage 25 by the alignment scope 27 which can simultaneously detect reticle set marks (not shown) formed on both the reticle 20 and reticle stage 25.

The alignment scope 27 uses exposure light as a light source, is configured to be movable to an arbitrary position above the reticle 20, and can detect both the reticle 20 and a wafer 40 via the projection optical system 30 at a plurality of image heights of the projection optical system 30. In other words, the alignment scope 27 can detect the positions of the reticle 20 and wafer 40. Note that a scope which detects the wafer 40 via the projection optical system 30, and that which detects the reticle set marks formed on both the reticle 20 and reticle stage 25 may be separate.

The projection optical system 30 forms a pattern on the wafer 40 by forming an image of light which bears the information of the pattern of the reticle 20 on the wafer 40. Note that a region on the wafer 40, to which the pattern of the reticle 20 is transferred by one exposure, is commonly called a shot.

The wafer stage 45 which can be driven in the X-, Y-, and Z-axis directions and rotation directions about the respective axes holds the wafer 40 via a wafer chuck 47. In this embodiment, the wafer 40 has alignment marks (upper-surface marks and lower-surface marks) formed on its upper surface and lower surface, respectively. Here, with respect to the substrate, the upper surface is a surface on the side of the detection apparatus, and, with respect to the substrate, the lower surface is a surface on the opposite side of the detection apparatus. Further, the upper-surface mark is a mark formed on the upper surface side and the lower-surface mark is a mark formed on the lower surface side. A reference mark RM and mirror 52 for baseline measurement (to be described later) are placed on the wafer stage 45. The interferometer 50 always measures the position of the wafer stage 45. More specifically, the interferometer 50 measures the position of the wafer stage 45 by irradiating the mirror 52 with laser light, and detecting the laser light reflected by the mirror 52.

The focus position measurement system 60 serves to align the wafer 40 with the imaging position (focus position) of the pattern of the reticle 20, formed by the projection optical system 30, at the time of exposing the wafer 40. In this embodiment, the focus position measurement system 60 includes a light source 601, lens 602, slit pattern 603, lens 604, mirror 605, lens 606, and photoelectric conversion device 607, and measures the surface position (the position in the Z-axis direction) of the wafer 40. More specifically, light emitted by the light source 601 illuminates the slit pattern 603 via the lens 602. An image of the slit pattern 603 is obliquely projected onto the wafer 40 via the lens 604 and mirror 605. The image of the slit pattern 603 projected onto the wafer 40 is reflected by the surface of the wafer 40, and reaches the photoelectric conversion device 607 such as a CCD via the lens 606. The surface position of the wafer 40 can be obtained from the position of the image of the slit pattern 603 obtained by the photoelectric conversion device 607.

The alignment detection apparatus 70 detects the alignment marks (upper-surface marks and lower-surface marks) formed in the wafer 40. The alignment detection apparatus 70 can detect both the lower-surface marks and upper-surface marks, formed in the wafer 40, using light (first light) with a wavelength which is transmitted through the wafer 40, and that (second light) with a wavelength which is not transmitted through the wafer 40, respectively, as will be described later.

The control unit 80 includes a CPU and memory, and controls the operation of the exposure apparatus 1. For example, the control unit 80 calculates, the array information of shots formed on the wafer 40, based on the measurement result obtained by the interferometer 50 and the detection result obtained by the alignment detection apparatus 70. Based on the shot array information, the control unit 80 controls the position of the wafer stage 45 so that the imaging position of the pattern of the reticle 20 formed by the projection optical system 30 is aligned with the position of one shot on the wafer 40. The control unit 80 also performs a process for obtaining the relative positional relationship (baseline) between the reticle 20 and the alignment detection apparatus 70, that is necessary to calculate the shot array information. The control unit 80 moreover performs a process for obtaining the relative positional relationship (baseline) between the projection optical system 30 (that is, the exposure position) and the alignment detection apparatus 70 using the reference mark RM placed on the wafer stage 45.

Figure 2:
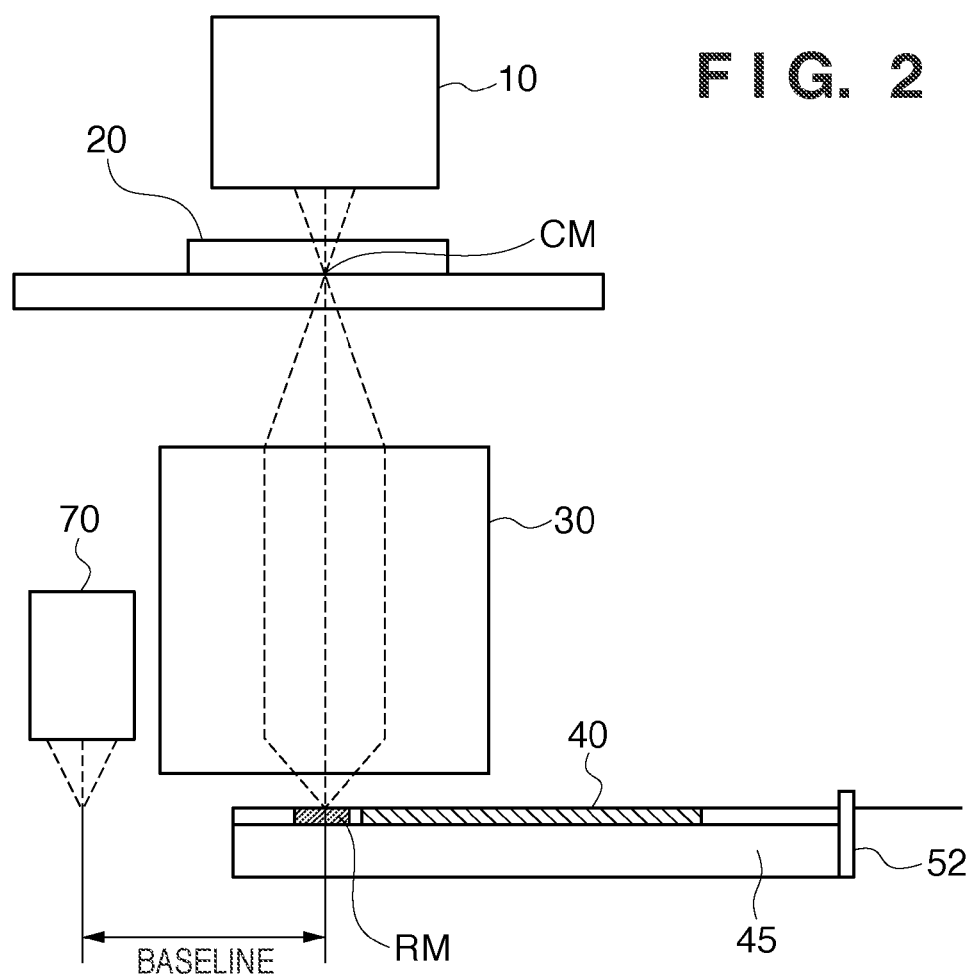
FIG. 2 is a view for explaining a process for obtaining the baseline in the exposure apparatus shown in FIG. 1.

A process for obtaining the baseline between the reticle 20 and the alignment detection apparatus 70 will be explained herein with reference to FIG. 2. The reticle 20 has a calibration mark CM formed on it as a position correction mark, as shown in FIG. 2.

The illumination optical system 10 illuminates the calibration mark CM formed on the reticle 20. The light having passed through the aperture pattern of the calibration mark CM forms an image of that aperture pattern at a best focus position on the wafer via the projection optical system 30.

An aperture pattern with the same size as the image (projected image) of the calibration mark CM is formed in the reference mark RM placed on the wafer stage 45. The light having passed through the aperture pattern of the reference mark RM reaches a photoelectric conversion device located below the reference mark RM. The photoelectric conversion device detects the intensity of the light having passed through the aperture pattern of the reference mark RM.

A position detection mark which can be detected by the alignment detection apparatus 70 is also formed on the reference mark RM. The position of the position detection mark can be obtained based on the detection result of the position detection mark obtained by the alignment detection apparatus 70 and the measurement result obtained by the interferometer 50 when the wafer stage 45 is driven so that the position detection mark falls within the detection region of the alignment detection apparatus 70. The baseline between the reticle 20 and the alignment detection apparatus 70 can then be obtained from the intensity of the light having passed through the aperture patterns of the calibration mark CM and reference mark RM, and the position of the position detection mark formed on the reference mark RM.

A process for obtaining the baseline between the projection optical system 30 and the alignment detection apparatus 70 will be explained. First, the calibration mark CM formed on the reticle 20 is driven to a predetermined position (the position where the light having passed through the aperture pattern of the calibration mark CM enters the projection optical system 30), and is illuminated by the illumination optical system 10. The light having passed through the aperture pattern of the calibration mark CM forms an image of that aperture pattern at the imaging position on the wafer via the projection optical system 30.

The wafer stage 45 is driven so that the aperture pattern of the reference mark RM is aligned with the image of the aperture pattern of the calibration mark CM. The reference mark RM is placed at the imaging position (best focus position) of the calibration mark CM. In this state, the intensity of the light having passed through the aperture pattern of the reference mark RM is detected by the photoelectric conversion device while driving the reference mark RM in the X-axis direction.

Figure 3:
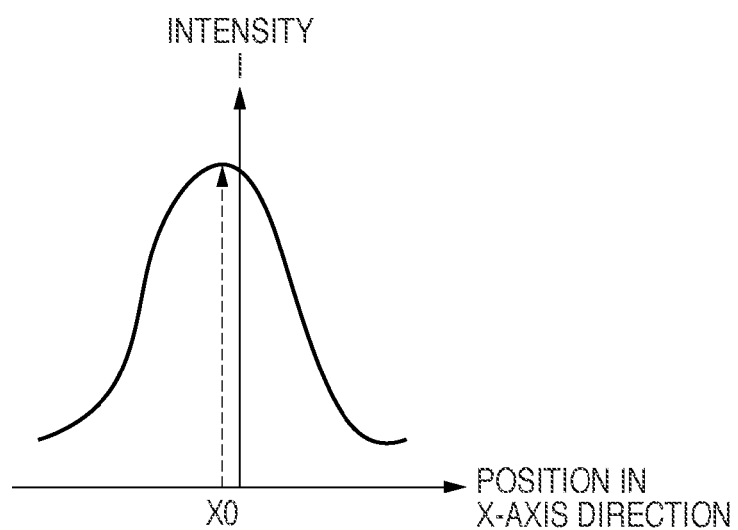
FIG. 3 is a graph showing the relationship between the position of a reference mark in the X-axis direction and the intensity of light having passed through the reference mark in the exposure apparatus shown in FIG. 1.

FIG. 3 is a graph showing the relationship between the position of the reference mark RM in the X-axis direction and the light intensity detected by the photoelectric conversion device. In FIG. 3, the abscissa indicates the position of the reference mark RM (its aperture pattern) in the X-axis direction, and the ordinate indicates the light intensity detected by the photoelectric conversion device. As the relative position between the calibration mark CM and the reference mark RM changes, the light intensity detected by the photoelectric conversion device also changes, as shown in FIG. 3. The light intensity detected by the photoelectric conversion device maximizes at the position (X0) where the aperture pattern of the calibration mark CM is aligned with that of the reference mark RM. The baseline between the projection optical system 30 and the alignment detection apparatus 70 can be obtained by determining the position X0 where the light intensity detected by the photoelectric conversion device maximizes, and detecting the position, on the wafer, of the image of the calibration mark CM projected by the projection optical system 30.

The shape (magnification and distortion) of the pattern of the reticle 20 can also be measured by forming a plurality of calibration marks CM on the reticle 20, and obtaining the positions of the plurality of calibration marks CM using the reference mark RM.

Figure 4:
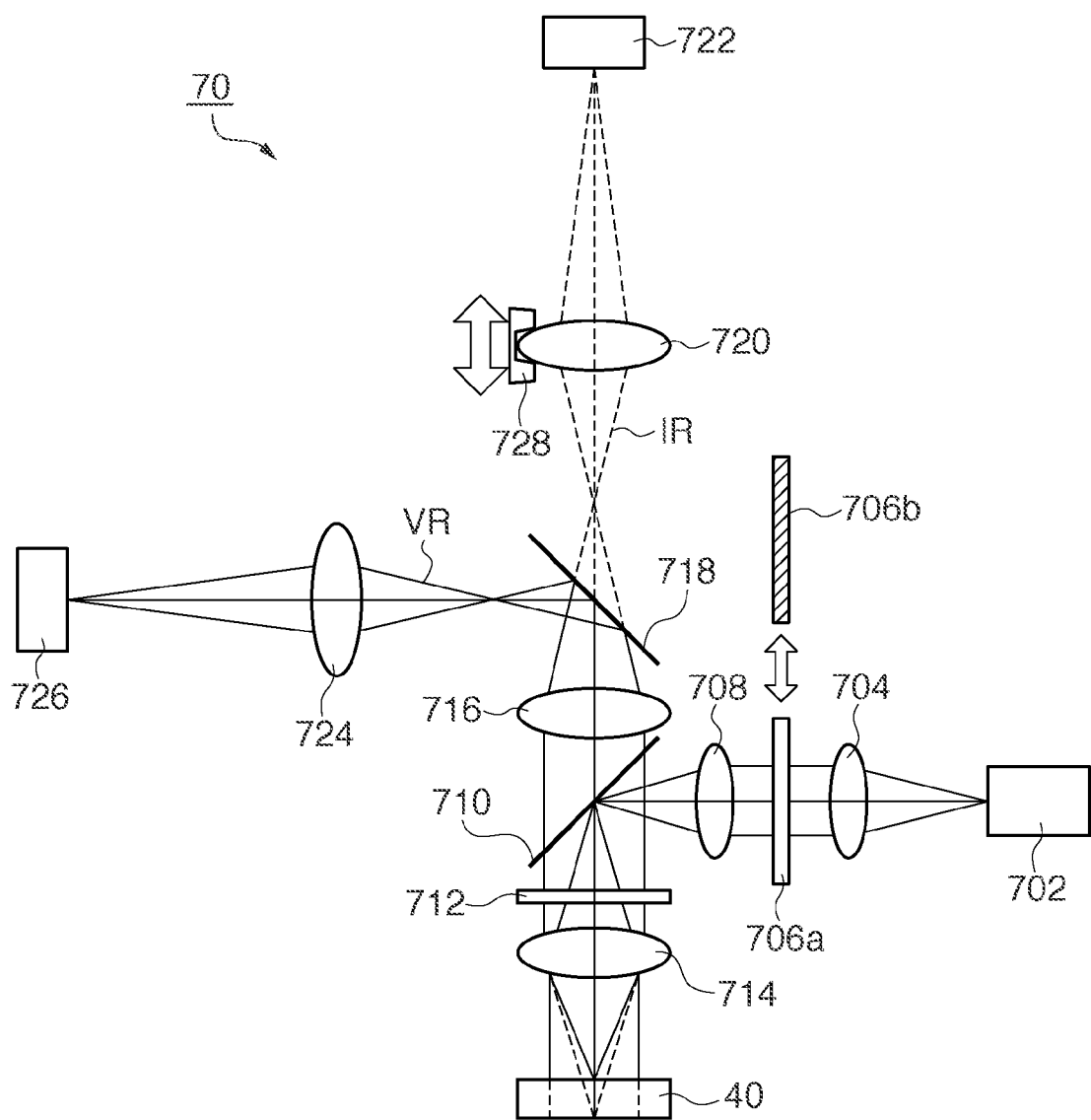
FIG. 4 is a view illustrating one example of the arrangement of an alignment detection apparatus of the exposure apparatus shown in FIG. 1.

The alignment detection apparatus 70 will be described in detail below. FIG. 4 is a view illustrating one example of the arrangement of the alignment detection apparatus 70. The alignment detection apparatus 70 includes a light source 702, collimator lens 704, wavelength filters 706a and 706b, relay lens 708, polarizing beam splitter 710, λ/4 plate 712, and objective lens 714. The alignment detection apparatus 70 also includes a relay lens 716, dichromic mirror 718, imaging lens 720, first photoelectric conversion device 722, imaging lens 724, second photoelectric conversion device 726, and driving unit 728.

The light source 702 emits light (first light) with a wavelength which is transmitted through the wafer 40, and that (second light) with a wavelength which is not transmitted through the wafer 40, and is, for example, a halogen lamp. FIG. 5 is a graph showing the transmittance of the wafer 40 (Si substrate) as a function of the wavelength of the incident light. In FIG. 5, the abscissa indicates the wavelength of the incident light, and the ordinate indicates the transmittance of the wafer 40. Referring to FIG. 5, the wafer 40 has a characteristic in which its transmittance increases as the wavelength of the incident light exceeds 1,000 nm. For this reason, in this embodiment, infrared light with a wavelength of 1,000 nm or more is adopted as the first light for detecting the lower-surface marks formed on the lower surface of the wafer 40. Also, visible light with a wavelength less than 1,000 nm is adopted as the second light for detecting the upper-surface marks formed on the upper surface of the wafer 40.

Light emitted by the light source 702 enters the polarizing beam splitter 710 via the collimator lens 704, the wavelength filter 706a or 706b, and the relay lens 708. The wavelength filter 706a transmits the visible component of the light from the light source 702, whereas the wavelength filter 706b transmits the infrared component of the light from the light source 702. The wavelength filters 706a and 706b can be individually, exclusively inserted in or retracted from the optical path. The wavelength filter 706a is inserted in the optical path when the upper-surface marks formed on the upper surface of the wafer 40 are detected, whereas the wavelength filter 706b is inserted in the optical path when the lower-surface marks formed on the lower surface of the wafer 40 are detected.

Although the wavelength filters 706a and 706b are used in this embodiment, a set of light sources which emit infrared light and visible light, respectively, and can be switched from one to the other may be used as the light source 702. In other words, it is only necessary that visible light and infrared light can be selectively guided onto the wafer 40.

The polarizing beam splitter 710 reflects light having an S-polarized component with polarization perpendicular to the paper surface toward the λ/4 plate 712. In this embodiment, the λ/4 plate 712 forms an optical isolator in cooperation with the polarizing beam splitter 710. The light having passed through the λ/4 plate 712 is converted into circularly polarized light, and Köhler-illuminates the wafer 40 via the objective lens 714 inserted between the wafer 40 and the λ/4 plate 712.

The light reflected (this reflection includes, for example, diffraction and scattering) by the alignment marks formed in the wafer 40 enters the polarizing beam splitter 710 via the objective lens 714 and λ/4 plate 712. Because the incident light on the polarizing beam splitter 710 is converted into light having a P-polarized component with polarization parallel to the paper surface, it is transmitted through the polarizing beam splitter 710.

The light transmitted through the polarizing beam splitter 710 enters the dichromic mirror 718, which has the property of transmitting infrared light and reflecting visible light, via the relay lens 716. The dichromic mirror 718 may be formed from a multilayer film made of a plurality of dielectric substances, or from an Si substrate with a transmittance characteristic as shown in FIG. 5.

Infrared light IR transmitted through the dichromic mirror 718 forms images of the lower-surface marks in the wafer 40 on the light-receiving surface of the first photoelectric conversion device 722 via the imaging lens (first lens) 720. On the other hand, visible light VR reflected by the dichromic mirror 718 forms images of the upper-surface marks in the wafer 40 on the light-receiving surface of the second photoelectric conversion device 726 via the imaging lens (second lens) 724.

In this manner, the positions of the lower-surface marks and upper-surface marks in the wafer 40 can be detected by using infrared light for the lower-surface marks in the wafer 40, and using visible light for the upper-surface marks in the wafer 40. However, the following problem may be posed when both the lower-surface marks and upper-surface marks in the wafer 40 are detected using infrared light and visible light, respectively. FIGS. 6A and 6B are sectional views schematically showing a cross-section of the wafer 40. FIG. 6A shows a case in which upper-surface marks AMs in the wafer 40 are detected using the visible light VR. FIG. 6B shows a case in which lower-surface marks AMb in the wafer 40 are detected using the infrared light IR.

As shown in FIGS. 6A and 6B, the detection surface for the visible light VR and that for the infrared light IR are generally located at the same position. For this reason, to detect, for example, the lower-surface marks AMb in the wafer 40, the wafer 40 needs to be driven in the Z-axis direction (height direction). As described above, the mirror 52 formed by polishing a low-thermal-expansion material to have a mirror finish is placed on the wafer stage 45 which drives the wafer 40, and has a residual polishing error. This means that the position of the wafer stage 45 measured by the interferometer 50 contains an error depending on the position on the mirror 52 irradiated with laser light from the interferometer 50. Thus, when the wafer 40 is driven in the Z-axis direction to detect the lower-surface marks AMb in the wafer 40, the position on the mirror 52 irradiated with laser light from the interferometer 50 also changes. This makes it difficult to precisely measure the position of the wafer stage 45.

The focus position measurement system 60 generally has its measurement range limited in order to guarantee measurement with high accuracy. Thus, when the wafer 40 is driven in the Z-axis direction to detect the lower-surface marks AMb in the wafer 40, it may fall outside the measurement range of the focus position measurement system 60.

Under the circumstance, in this embodiment, to obviate the need to drive the wafer 40 in the Z-axis direction to detect the lower-surface marks AMb in the wafer 40, the objective lens 714 is located such that the imaging position of the infrared light IR on the wafer is different from that of the visible light VR. A predetermined on-axis chromatic aberration in the objective lens 714 is generally corrected. However, an on-axis chromatic aberration is generated in the objective lens 714 according to this embodiment so that the infrared light reflected by the lower-surface marks AMb in the wafer 40 and the visible light reflected by the upper-surface marks AMs in the wafer 40 form images on the light-receiving surfaces of the first photoelectric conversion device 722 and second photoelectric conversion device 726, respectively.

Also, in this embodiment, the driving unit 728 which drives the imaging lens 720 to an optimum position in its axial direction based on the thickness of the wafer 40 is used. The lower-surface marks in the wafer 40 are detected by the first photoelectric conversion device 722 using infrared light while visible light is focused on the upper-surface marks in the wafer 40. The contrast of the image obtained by the first photoelectric conversion device 722 is calculated, and a best focus position is calculated from the calculated contrast and the position of the imaging lens 720. In other words, the position of the imaging lens 720 in its axial direction (best focus position) is obtained in accordance with the thickness of the wafer 40, and the positions of the lower-surface marks in the wafer 40 are detected using infrared light while the imaging lens 720 is driven to at the obtained position. Note that designing an optical system including the imaging lens 720, relay lens 716, and objective lens 714 as a telecentric imaging system allows its magnification to stay constant even when the imaging lens 720 is driven in its axial direction by the driving unit 728. Note also that the imaging lens 720 may be driven not in its axial direction but in a direction different from its axial direction by the driving unit 728, and the lower-surface marks in the wafer 40 may shift (that is, the baseline length may change). In this case, the baseline need only be calculated using the reference mark RM placed on the wafer stage 45. At this time, it is desirable to place a plurality of reference marks RM with different thicknesses on the wafer stage 45, and use a reference mark RM with a thickness closest to that of the wafer 40.

Although an arrangement which adjusts the focus of infrared light by driving the imaging lens 720 in its axial direction using the driving unit 728 has been described in this embodiment, the first photoelectric conversion device 722 or the relay lens 716, for example, may be driven in the axial direction. Also, the focus of visible light may be adjusted by driving the imaging lens 724 in its axial direction, or an optical member which can change the optical path length may be inserted in the optical path of the alignment detection apparatus 70.

Also, although visible light and infrared light are extracted from light, emitted by the light source 702, using the wavelength filters 706a and 706b in this embodiment, the alignment detection condition, that is, the wavelength extraction condition may be changed. Since the interference condition changes depending on the materials and thicknesses of the alignment marks formed in the wafer 40, images with high contrast can be obtained by the photoelectric conversion devices by changing the wavelengths to be extracted.

The wavelength filters 706a and 706b are not indispensable for the alignment detection apparatus 70, and the dichromic mirror 718 can separate visible light and infrared light even when the wafer 40 is irradiated with the visible light and the infrared light at once. In this case, the visible light and the infrared light, that is, the upper-surface marks and lower-surface marks in the wafer 40 can be detected at once. This makes it possible to use the alignment detection apparatus 70 as a so-called overlay detection apparatus which detects the state in which the upper-surface marks and lower-surface marks in the wafer 40 are overlaid.

Figure 7A:
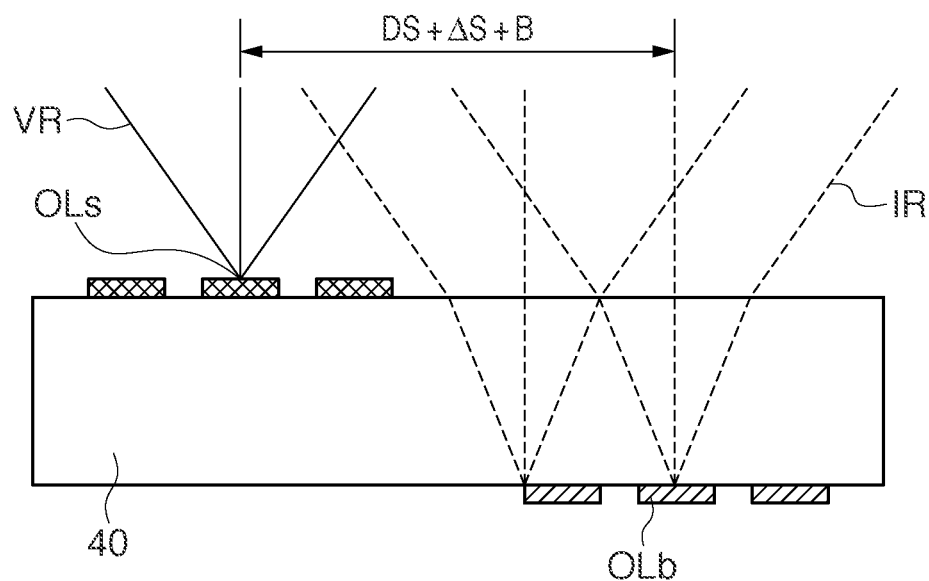
FIGS. 7A and 7B are a sectional view and a top view, respectively, for explaining a case in which the alignment detection apparatus is used as an overlay detection apparatus in the exposure apparatus shown in FIG. 1.
Figure 7B:
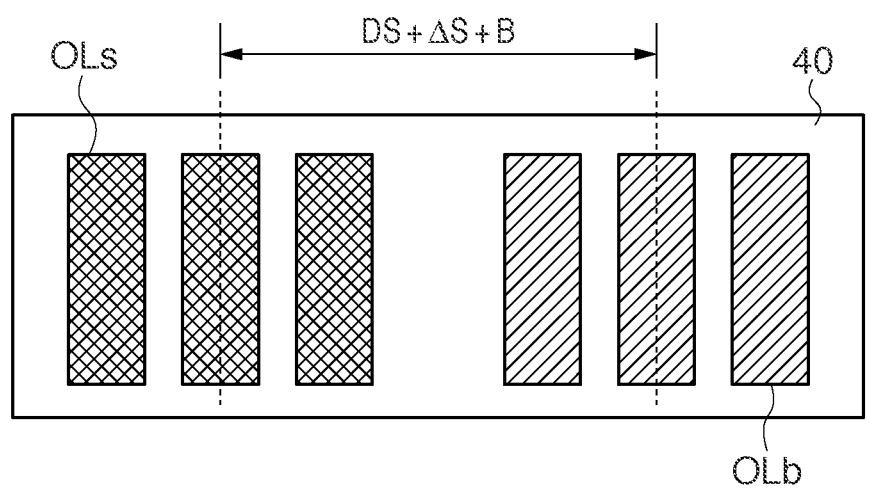

A case in which the alignment detection apparatus 70 is used as an overlay detection apparatus will be explained with reference to FIGS. 7A and 7B. FIG. 7A is a sectional view schematically showing overlay inspection marks OLs and OLb formed on the upper surface and lower surface, respectively, of the wafer 40. FIG. 7B is a top view schematically showing the overlay inspection marks OLs and OLb. Overlay accuracy can be obtained using the alignment detection apparatus 70 to detect the distance $S=DS+\Delta S+B$ between the overlay inspection marks OLs and OLb, where DS is the design value of the distance between the overlay inspection marks OLs and OLb, $\Delta S$ is the overlay error, and B is the detection distance between infrared light and visible light. Since the detection distance B between infrared light and visible light is calculated in advance using the reference mark RM, the overlay error $\Delta S$ can be obtained by detecting the distance S. Note that the overlay inspection marks OLs and OLb need to be arranged by taking account of divergence of the light from the overlay inspection marks OLb to prevent the light from the overlay inspection marks OLb from turning into noise.

In this manner, the alignment detection apparatus 70 forms a detection system which detects various types of marks, formed on the upper surface of the wafer 40, using visible light, and that which detects various types of marks, formed on the lower surface of the wafer 40, using infrared light. Hence, the alignment detection apparatus 70 can detect the marks formed on both the upper surface and lower surface of the wafer 40. Also, an on-axis chromatic aberration is generated in the objective lens 714, and the imaging lens 720 or 724 is driven based on the thickness of the wafer 40, thereby obviating the need to drive the wafer 40 in the Z-axis direction. This makes it possible to detect the marks formed on the upper surface and lower surface of the wafer 40 with high accuracy.

Figure 8:
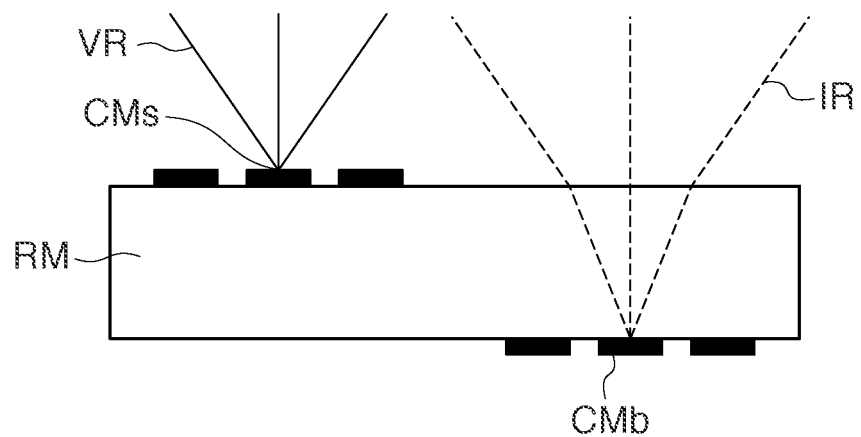
FIG. 8 is a sectional view schematically showing the arrangement of the reference mark in the exposure apparatus shown in FIG. 1.

The arrangement of the reference mark RM for obtaining the baseline between the reticle 20 and the alignment detection apparatus 70 will be explained herein. FIG. 8 is a sectional view schematically showing the arrangement of the reference mark RM. The reference mark RM is formed from a glass substrate with transparency for infrared light, and has calibration marks CMs formed on its upper surface and calibration marks CMb formed on its lower surface. A thickness tg of the reference mark RM and a thickness is of the wafer 40 satisfy a relation tg/ng=ts/ns where ng is the refractive index of glass, and ns is the refractive index of silicon. If a plurality of wafers 40 with different thicknesses are exposed, it is desirable to prepare a plurality of reference marks RM with different thicknesses, and use a reference mark RM with a thickness closest to that of the wafer 40, that satisfies tg/ng=ts/ns. This makes it possible to detect the calibration marks CMs and CMb without driving the reference mark RM in the Z-axis direction even when the calibration marks CMs and CMb are detected using visible light and infrared light, respectively. Although the reference mark RM is formed from a glass substrate in this embodiment, it may be formed from an Si substrate, like the wafer 40. In this case, the wafer 40 and reference mark RM have the same thickness, as a matter of course.

The relative position between the calibration marks CMs and CMb may be determined by using a value measured in advance on the outside of the exposure apparatus 1, or by detecting the upper-surface marks and lower-surface marks in the wafer 40 using the reference mark RM and correcting that position based on the exposure result.

Obtaining the baseline using infrared light can be omitted by measuring the relative position between the calibration marks CMs and CMb in advance to obtain the baseline using visible light, and shifting the baseline by an amount corresponding to the measured relative position. As infrared light has a wavelength longer than visible light, the former generates a mark contrast lower than the latter. Since mark detection accuracy changes in proportion to the contrast, the correction can be performed with a higher accuracy by obtaining the baseline using visible light with a higher contrast.

Figure 9:
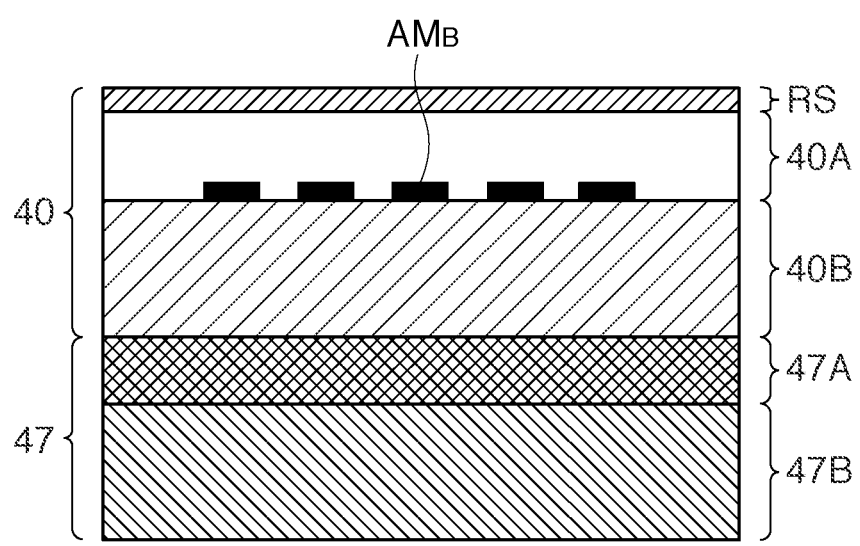
FIG. 9 is a sectional view schematically showing lower-surface-side marks formed on the lower surface side of the wafer.

Detection of the lower-surface marks in the wafer 40 will be explained in detail with reference to FIG. 9. FIG. 9 is a sectional view schematically showing lower-surface marks $AM_B$ formed on the lower surface of the wafer 40. The wafer 40 includes an Si substrate 40A and glass substrate 40B, which are bonded together by, for example, an adhesive or optical contact. Also, the upper surface of the Si substrate 40A is coated with a photoresist (photosensitive agent) RS. The lower surface of the Si substrate 40A has the lower-surface marks $AM_B$ which are formed on it and made of, for example, a metal. Thus, the lower-surface marks $AM_B$ are sandwiched between the Si substrate 40A and the glass substrate 40B. The positions of the lower-surface marks $AM_B$ are obtained by irradiating them with infrared light, and detecting the infrared light reflected by them.

The wafer 40 is chucked by vacuum suction by the wafer chuck 47, as described above. A wafer chuck in a conventional semiconductor exposure apparatus may reflect infrared light applied to the lower-surface marks $AM_B$, so the infrared light reflected by the surface of the wafer chuck often turns into noise light and deteriorates images of the lower-surface marks $AM_B$. To prevent this, in this embodiment, the wafer chuck 47 has a double-layered structure, in which an antireflection coating 47A which prevents reflection of infrared light is formed on a main body portion 47B to come into contact with the wafer 40. However, the antireflection coating 47A may be formed in or on the wafer 40. The antireflection coating 47A can be formed in the wafer 40 at the position between the Si substrate 40A and the glass substrate 40B or on the wafer 40 at the position of the lower surface of the glass substrate 40B. Also, to prevent a rise in temperature of the wafer 40 due to irradiation with infrared light, it is desirable to provide a cooling mechanism and a temperature sensor to the wafer chuck 47, and control contraction of the wafer 40.

Moreover, an antireflection coating, which prevents reflection of infrared light, is desirably formed on the upper surface of the Si substrate 40A. Because the Si substrate 40A has a refractive index for infrared light, that is higher than typical glass, the upper surface of the Si substrate 40A reflects infrared light in an amount larger than typical glass (about 30%). Thus, infrared light reflected by the lower-surface marks $AM_B$ is superposed on that reflected by the upper surface of the Si substrate 40A, resulting in a decrease in contrast. To prevent this, a coating which prevents reflection of exposure light is formed under the photoresist RS, and a coating (an $SiO_2$ coating or a ZnS coating) which prevents reflection of infrared light is formed under that coating. This makes it possible to obtain an image with high contrast.

Even if the thickness of the wafer 40 is nonuniform, the alignment detection apparatus 70 can detect both the upper-surface marks and lower-surface marks in the wafer 40 without driving the wafer 40 in the Z-axis direction by driving the imaging lens 720 in its axial direction. In contrast, if the thickness of the wafer 40 is uniform, an alignment detection apparatus 70A with an arrangement simpler than the alignment detection apparatus 70 can be used, as shown in FIG. 10.

Figure 10:
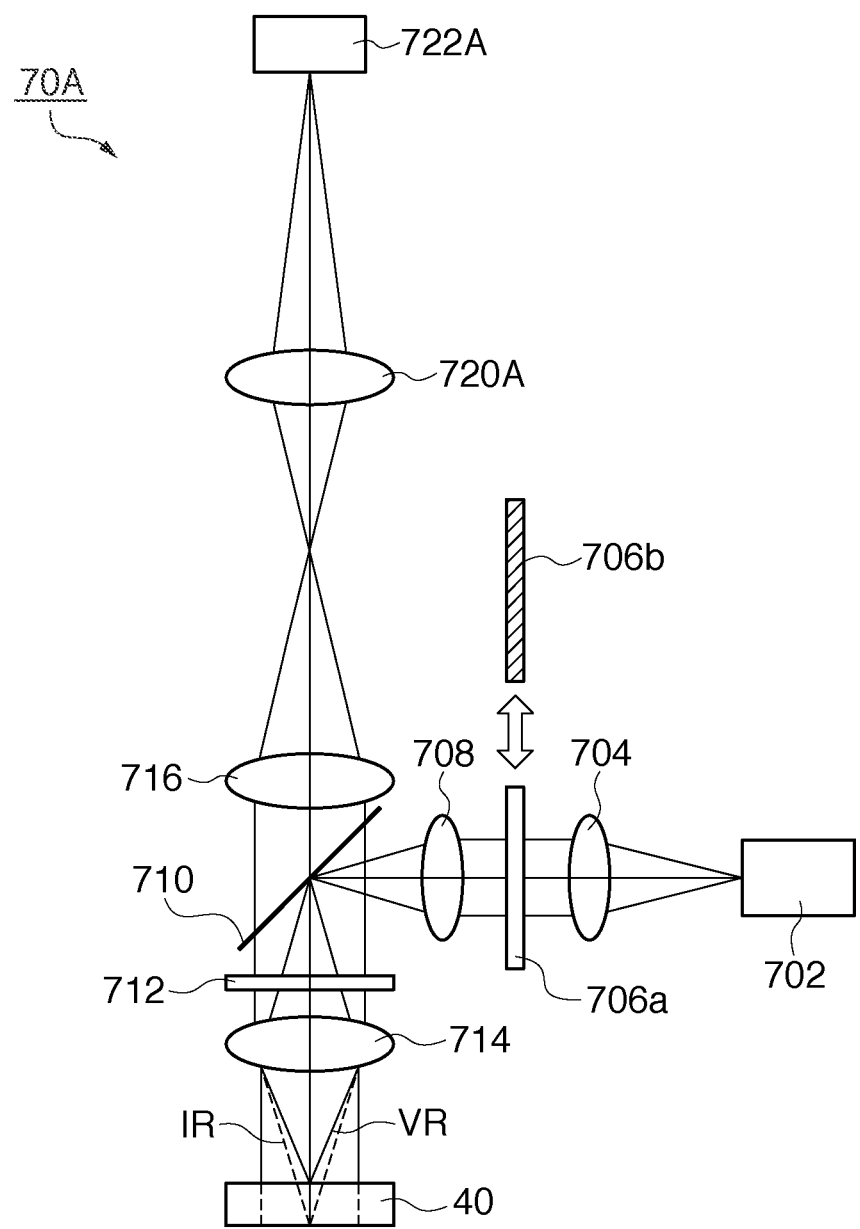
FIG. 10 is a view illustrating one example of the arrangement of an alignment detection apparatus applicable to the exposure apparatus shown in FIG. 1.

Referring to FIG. 10, light reflected (this reflection includes, for example, diffraction and scattering) by the alignment marks formed in a wafer 40 enters a polarizing beam splitter 710 via an objective lens 714 and λ/4 plate 712. The light transmitted through the polarizing beam splitter 710 forms images of the alignment marks in the wafer 40 on the light-receiving surface of a photoelectric conversion device 722A via a relay lens 716 and imaging lens 720A.

In the alignment detection apparatus 70A, an on-axis chromatic aberration between visible light and infrared light is intentionally generated in the objective lens 714. More specifically, an on-axis chromatic aberration is generated in the objective lens 714 so that visible light is focused on the upper surface of the wafer 40, and infrared light is focused on the lower surface of the wafer 40. The on-axis chromatic aberration causes both the infrared light reflected by the lower-surface marks and the visible light reflected by the upper-surface marks to form images on the light-receiving surface of the photoelectric conversion device 722A by taking account of the difference in optical path length between the upper-surface marks and the lower-surface marks due to factors associated with the thickness of the wafer 40.

For example, an on-axis chromatic aberration $\Delta F$ between infrared light and visible light generated in the objective lens 714 need only satisfy $\Delta F = t/n$ where n is the refractive index of Si for infrared light (about 3.6 for a wavelength of 1,100 nm), and t is the thickness of the wafer 40.

Figure 11A:
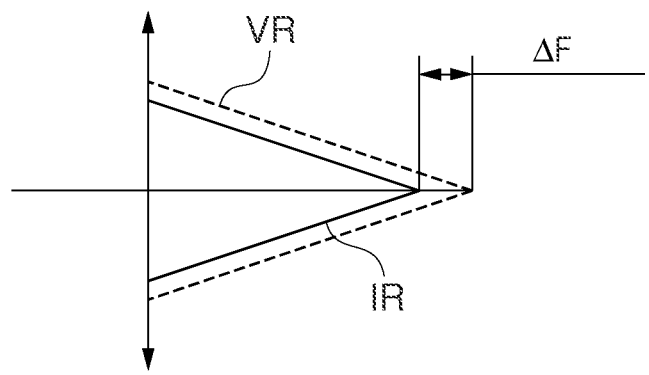
FIGS. 11A and 11B are views for explaining the relationships between an on-axis chromatic aberration and a set of visible light and infrared light.
Figure 11B:
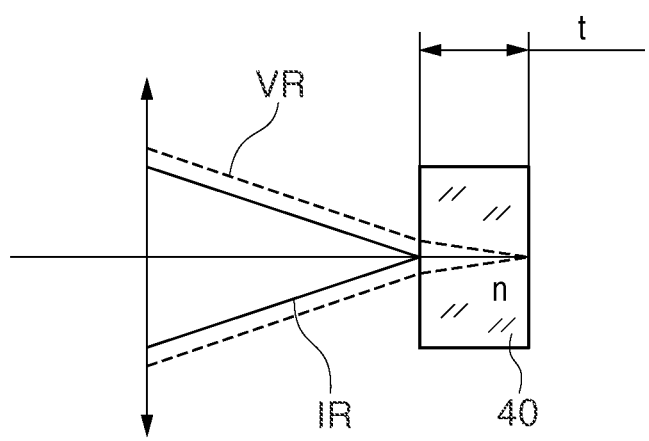

FIGS. 11A and 11B are views for explaining the relationships between an on-axis chromatic aberration and a set of visible light and infrared light. FIG. 11A shows a case in which infrared light IR is intentionally shifted by $\Delta F$ in the focus direction (Z-axis direction) relative to visible light VR while a wafer 40 is not inserted in the optical path. FIG. 11B shows a case in which infrared light IR is intentionally shifted by $\Delta F$ in the focus direction (Z-axis direction) relative to visible light VR while a wafer 40 with the thickness t is inserted in the optical path. As can be seen by referring to FIG. 11B, the visible light VR is focused on the upper surface of the wafer 40, while the infrared light IR is focused on the lower surface of the wafer 40. It is also possible to correct a spherical aberration, generated in the wafer 40 by infrared light, using a lens such as the objective lens 714.

The amount of on-axis chromatic aberration generated in the objective lens 714 is not limited to $\Delta F = t/n$ as long as it is possible to detect both the upper-surface marks and lower-surface marks in the wafer 40 without driving the wafer 40 in the Z-axis direction. Also, an on-axis chromatic aberration may be generated in another lens such as the relay lens 716 instead of being generated in the objective lens 714. Moreover, an optical member with an on-axis chromatic aberration may be inserted in the optical path of the alignment detection apparatus 70A.

In exposure, light emitted by the light source illuminates the reticle 20 via the illumination optical system 10. The light which bears the information of the mask pattern upon passing through the reticle 20 forms an image on the wafer 40 via the projection optical system 30. At this time, the position of the wafer 40 is controlled with high accuracy based on the detection result of the lower-surface marks and upper-surface marks obtained by the above-mentioned alignment detection apparatus 70 or 70A. Hence, the exposure apparatus 1 can provide high-quality devices (for example, a semiconductor integrated circuit device and a liquid crystal display device) with a high throughput and good economical efficiency.

These devices are fabricated by a step of exposing a substrate (for example, a wafer or a glass plate) coated with a photoresist (photosensitive agent) using the exposure apparatus 1, a step of developing the exposed substrate, and subsequent known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-186150 filed on Aug. 10, 2009, which is hereby incorporated by reference herein in its entirety.

What is claimed is:

1. A detection apparatus for detecting an upper-surface mark and a lower-surface mark formed on an upper surface and a lower surface, respectively, of a substrate onto which a pattern is transferred, the apparatus comprising:
    a light source configured to emit first light with a wavelength that transmits through the substrate, and second light with a wavelength that does not transmit through the substrate;
    a photoelectric conversion device having a light-receiving surface; and
    an optical system configured to form:
    an image of the lower-surface mark on the light-receiving surface of the photoelectric conversion device using the first light emitted by the light source, applied to the lower-surface mark from an upper surface side of the substrate, and reflected by the lower-surface mark; and
    an image of the upper-surface mark on the light-receiving surface of the photoelectric conversion device using the second light emitted by the light source, applied to the upper-surface mark from the upper surface side of the substrate, and reflected by the upper-surface mark,
    wherein the optical system includes a lens having an on-axis chromatic aberration to form the image of the lower-surface mark using the first light and the image of the upper-surface mark using the second light on the light-receiving surface of the photoelectric conversion device.

2. The apparatus according to claim 1, wherein:
    the photoelectric conversion device includes a first photoelectric conversion device having a first light-receiving surface and a second photoelectric conversion device having a second light-receiving surface, and
    the optical system forms the image of the lower-surface mark on the first light-receiving surface of the first photoelectric conversion device, and forms the image of the upper-surface mark on the second light-receiving surface of the second photoelectric conversion device.

3. The apparatus according to claim 2, wherein the lens is configured to form:
    an image of the first light reflected by the lower-surface mark on the first light-receiving surface of the first photoelectric conversion device, and
    an image of the second light reflected by the upper-surface mark on the second light-receiving surface of the second photoelectric conversion device.

4. The apparatus according to claim 3, wherein the optical system further includes:
    a first lens that is different from the lens and configured to form the image of the first light reflected by the lower-surface mark on the first light-receiving surface of the first photoelectric conversion device; and
    a driving unit configured to drive the first lens in an axial direction thereof based on a thickness of the substrate.

5. The apparatus according to claim 1, wherein the lens is configured to form:
    an image of the first light reflected by the lower-surface mark on the light-receiving surface of the photoelectric conversion device in accordance with the wavelength of the first light, and
    an image of the second light reflected by the upper-surface mark on the light-receiving surface of the photoelectric conversion device in accordance with the wavelength of the second light.

6. An exposure apparatus comprising:
    a projection optical system configured to project a pattern onto a substrate;
    a stage configured to hold the substrate;
    a detection apparatus configured to detect an upper-surface mark and a lower-surface mark formed on an upper surface and a lower surface, respectively, of the substrate; and
    a control unit configured to control a position of the stage based on the detection result obtained by the detection apparatus,
    wherein the detection apparatus includes:
    a light source configured to emit first light with a wavelength that transmits through the substrate, and second light with a wavelength that does not transmit through the substrate,
    a photoelectric conversion device having a light-receiving surface, and
    an optical system configured to form:
    an image of the lower-surface mark on the light-receiving surface of the photoelectric conversion device using the first light emitted by the light source, applied to the lower-surface mark from an upper surface side of the substrate, and reflected by the lower-surface mark; and
    an image of the upper-surface mark on the light-receiving surface of the photoelectric conversion device using the second light emitted by the light source, applied to the upper-surface mark from the upper surface side of the substrate, and reflected by the upper-surface mark,
    wherein the optical system includes a lens having an on-axis chromatic aberration to form the image of the lower-surface mark using the first light and the image of the upper-surface mark using the second light on the light-receiving surface of the photoelectric conversion device.

7. The apparatus according to claim 6, further comprising:
    a reference mark used in measurement of a relationship between the detection apparatus and an exposure position,
    wherein the reference mark is placed on the stage at a height identical to a height of the substrate.

8. A device fabrication method comprising steps of:
    exposing a substrate using an exposure apparatus; and
    performing a development process for the exposed substrate,
    wherein the exposure apparatus includes:
    a projection optical system configured to project a pattern onto the substrate;
    a stage configured to hold the substrate;
    a detection apparatus configured to detect an upper-surface mark and a lower-surface mark formed on an upper surface and a lower surface, respectively, of the substrate; and a control unit configured to control a position of the stage based on the detection result obtained by the detection apparatus, wherein the detection apparatus includes:

a light source configured to emit first light with a wavelength that transmits through the substrate, and second light with a wavelength that does not transmit through the substrate, a photoelectric conversion device having a light-receiving surface, and an optical system configured to form:

an image of the lower-surface mark on the light-receiving surface of the photoelectric conversion device using the first light by the light source, applied to the lower-surface mark from an upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes a lens having an on-axis chromatic aberration to form the image of the lower-surface mark using the first light and the image of the upper-surface mark using the second light on the light-receiving surface of the photoelectric conversion device.

9. A detection apparatus for detecting an upper-surface mark and a lower-surface mark formed on an upper surface and lower surface, respectively, of a substrate onto which a pattern is transferred, the apparatus comprising:

a light source configured to emit first light with a wavelength that transmits through the substrate, and second light with a wavelength that does not transmit through the substrate;

a photoelectric conversion device having a light-receiving surface; and an optical system configured to form:

an image of the lower-surface mark on the light-receiving surface of the photoelectric conversion device using the first light emitted by the light source, applied to the lower-surface mark from the upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes:

a lens to form the image of the lower-surface mark using the first light on the light-receiving surface of the photoelectric conversion device; and a driving unit configured to drive the lens in an axial direction thereof based on a thickness of the substrate.

10. The apparatus according to claim 9, wherein:

the photoelectric conversion device includes a first photoelectric conversion device having a first light-receiving surface and a second photoelectric conversion device having a second light-receiving surface, and the optical system forms the image of the lower-surface mark on the first light-receiving surface of the first photoelectric conversion device, and forms the image of the upper-surface mark on the second light-receiving surface of the second photoelectric conversion device.

11. An exposure apparatus comprising:

a projection optical system configured to project a pattern onto a substrate;

a stage configured to hold the substrate;

a detection apparatus configured to detect an upper-surface mark and a lower-surface mark formed on an upper surface and a lower surface, respectively, of the substrate; and a control unit configured to control a position of the stage based on the detection result obtained by the detection apparatus, wherein the detection apparatus includes:

a light source configured to emit first light with a wavelength that transmits through the substrate, and second light with a wavelength that does not transmit through the substrate;

a photoelectric conversion device having a light-receiving surface; and an optical system configured to form:

an image of the lower-surface mark on the light-receiving surface of the photoelectric conversion device using the first light emitted by the light source, applied to the lower-surface mark from the upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes:

a lens to form the image of the lower-surface mark using the first light on the light-receiving surface of the photoelectric conversion device; and a driving unit configured to drive the lens in an axial direction thereof based on a thickness of the substrate.

12. A device fabrication method comprising steps of:

exposing a substrate using an exposure apparatus; and performing a development process for the substrate exposed, wherein the exposure apparatus includes:

a projection optical system configured to project a pattern onto the substrate;

a stage configured to hold the substrate;

a detection apparatus configured to detect an upper-surface mark and a lower-surface mark formed on an upper surface and a lower surface, respectively, of the substrate; and a control unit configured to control a position of the stage based on the detection result obtained by the detection apparatus, wherein the detection apparatus includes:

a light source configured to emit first light with a wavelength that transmits through the substrate, and second light with a wavelength that does not transmit through the substrate;

a photoelectric conversion device having a light-receiving surface; and an optical system configured to form:

an image of the lower-surface mark on the light-receiving surface of the photoelectric conversion device using the first light emitted by the light source, applied to the lower-surface mark from the upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes:

a lens to form the image of the lower-surface mark using the first light on the light-receiving surface of the photoelectric conversion device; and a driving unit configured to drive the lens in an axial direction thereof based on a thickness of the substrate.

13. A detection apparatus for detecting an upper-surface mark and a lower-surface mark formed on an upper surface and a lower surface, respectively, of a substrate onto which a pattern is transferred, the apparatus comprising:

a light source configured to emit first light of infrared light and second light of non-infrared light;

a photoelectric conversion device having a light-receiving surface; and an optical system configured to form:

an image of the lower-surface mark on the light-receiving surface of the photoelectric conversion device using the first light emitted by the light source, applied to the lower-surface mark from the upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes a lens having an on-axis chromatic aberration to form the image of the lower-surface mark using the first light and the image of the upper-surface mark using the second light on the light-receiving surface of the photoelectric conversion device.

14. The apparatus according to claim 13, wherein the second light is visible light.

15. A detection apparatus for detecting an upper-surface mark and a lower-surface mark formed on an upper surface and a lower surface, respectively, of a substrate onto which a pattern is transferred, the apparatus comprising:

a light source configured to emit first light of infrared light and second light of non-infrared light;

a photoelectric conversion device having a light-receiving surface; and an optical system configured to form:

an image of the lower-surface mark on the light-receiving surface of the photoelectric conversion device using the first light emitted by the light source, applied to the lower-surface mark from the upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes:

a lens to form the image of the lower-surface mark using the first light on the light-receiving surface of the photoelectric conversion device; and a driving unit configured to drive the lens in an axial direction thereof based on a thickness of the substrate.

16. The apparatus according to claim 15, wherein the second light is visible light.

17. An exposure apparatus for forming a pattern onto a substrate, the exposure apparatus comprising:

a stage configured to hold the substrate;

a detection apparatus configured to detect an upper-surface mark and a lower-surface mark formed on an upper surface and a lower surface, respectively, of the substrate; and a control unit configured to control a position of the stage based on the detection result obtained by the detection apparatus, wherein the detection apparatus includes:

a light source configured to emit first light with a wavelength that transmits through the substrate, and second light with a wavelength that does not transmit through the substrate, a photoelectric conversion device having a light-receiving surface; and an optical system configured to form:

an image of the lower-surface mark on the light-receiving surface of the photoelectric conversion device using the first light emitted by the light source, applied to the lower-surface mark from an upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes a lens having an on-axis chromatic aberration to form the image of the lower-surface mark using the first light and the image of the upper-surface mark using the second light on the light-receiving surface of the photoelectric conversion device.

18. A device fabrication method comprising the steps of:

forming a pattern onto a substrate using an exposure apparatus; and performing a development process for the substrate formed the pattern;

wherein the exposure apparatus includes:

a stage configured to hold the substrate;

a detection apparatus configured to detect an upper-surface mark and a lower-surface mark formed on an upper surface and a lower surface, respectively, of the substrate; and a control unit configured to control a position of the stage based on the detection result obtained by the detection apparatus, wherein the detection apparatus includes:

a light source configured to emit first light with a wavelength that transmits through the substrate, and second light with a wavelength that does not transmit through the substrate, a photoelectric conversion device having a light-receiving surface; and an optical system configured to form:

an image of the lower-surface mark on the light-receiving surface of the photoelectric conversion device using the first light by the light source, applied to the lower-surface mark from an upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes a lens having an on-axis chromatic aberration to form the image of the lower-surface mark using the first light and the image of the upper-surface mark using the second light on the light-receiving surface of the photoelectric conversion device.

19. An exposure apparatus which forms a pattern onto a substrate comprising:

a stage configured to hold the substrate;

a detection apparatus configured to detect an upper-surface mark and a lower-surface mark formed on an upper surface and a lower surface, respectively, of the substrate; and a control unit configured to control a position of the stage based on the detection result obtained by the detection apparatus, wherein the detection apparatus includes:

a light source configured to emit first light with a wavelength that transmits through the substrate, and second light with a wavelength that does not transmit through the substrate;

a photoelectric conversion device having a light-receiving surface; and an optical system configured to form:

an image of the lower-surface mark on the light-receiving surface of the photoelectric conversion device using the first light emitted by the light source, applied to the lower-surface mark from the upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes:

a lens to form the image of the lower-surface mark using the first light on the light-receiving surface of the photoelectric conversion device; and a driving unit configured to drive the lens in an axial direction thereof based on a thickness of the substrate.

20. A device fabrication method comprising steps of:

forming a pattern onto a substrate using an exposure apparatus; and performing a development process for the substrate formed the pattern, wherein the exposure apparatus includes:

a stage configured to hold the substrate;

a detection apparatus configured to detect an upper-surface mark and a lower-surface mark formed on an upper surface and a lower surface, respectively, of the substrate; and a control unit configured to control a position of the stage based on the detection result obtained by the detection apparatus, wherein the detection apparatus includes:

a light source configured to emit first light with a wavelength that transmits through the substrate, and second light with a wavelength that does not transmit through the substrate;

a photoelectric conversion device having a light-receiving surface; and an optical system configured to form:

an image of the lower-surface mark on the light-receiving surface of the photoelectric conversion device using the first light emitted by the light source, applied to the lower-surface mark from the upper surface side of the substrate, and reflected by the lower-surface mark; and an image of the upper-surface mark on the light-receiving surface of the photoelectric conversion device using the second light emitted by the light source, applied to the upper-surface mark from the upper surface side of the substrate, and reflected by the upper-surface mark, wherein the optical system includes:

a lens to form the image of the lower-surface mark using the first light on the light-receiving surface of the photoelectric conversion device; and a driving unit configured to drive the lens in an axial direction thereof based on a thickness of the substrate.

* * * * *